United States Patent [19]

Edelstein

[11] Patent Number: 5,043,693
[45] Date of Patent: Aug. 27, 1991

[54] HETEROGENEOUS MAGNETORESISTIVE LAYER

[75] Inventor: Alan S. Edelstein, Alexandria, Va.

[73] Assignee: The United States of America as represented by the Secretary of the Navy, Washington, D.C.

[21] Appl. No.: 565,781

[22] Filed: Aug. 13, 1990

[51] Int. Cl.⁵ .............................. H01L 43/00
[52] U.S. Cl. ................... 338/32 R
[58] Field of Search ................. 338/32 R, 32 H; 148/304, 403; 324/252

[56] References Cited

U.S. PATENT DOCUMENTS

| | | |
|---|---|---|
| 4,047,236 | 9/1977 | Lee . |
| 4,476,454 | 10/1984 | Aboaf et al. . |
| 4,482,400 | 11/1984 | O'Handley ................ 148/304 |
| 4,566,917 | 1/1986 | O'Handley ................ 148/304 |
| 4,618,542 | 10/1986 | Morita et al. . |
| 4,663,607 | 5/1987 | Kitada et al. ............ 338/32 R X |
| 4,755,239 | 7/1988 | O'Handley ................ 148/304 |
| 4,782,413 | 11/1988 | Howard et al. . |
| 4,789,910 | 12/1988 | Otsuka et al. . |
| 4,827,218 | 5/1989 | Meunier et al. . |

Primary Examiner—Marvin M. Lateef
Attorney, Agent, or Firm—Thomas E. McDonnell; Barry A. Edelberg

[57] ABSTRACT

A magnetoresistive material includes discrete units of magnetostrictive material separated from one another by one or more gaps. In one class of embodiments, magnetostrictive particles are embedded in a phase-separated nonmagnetostrictive matrix. In one embodiment a magnetoresistive article is made by co-sputtering particles of a magnetrostrictive material and a quantity of a nonmagnetostrictive material onto an nonmagnetostrictive substrate. The magnetostrictive particles are spaced from one another by distances in the range of 10 to 100 angstroms. In another embodiment, a magnetoresistive article is made by employing relatively large magnetostrictive electrodes separated by a small gap on a nonmagnetostrictive substrate. Magnetic field sensors employing such articles are also provided.

24 Claims, 2 Drawing Sheets

HETEROGENEOUS MAGNETORESISTIVE LAYER

BACKGROUND OF THE INVENTION

The present invention described herein relates to the materials and devices whose electrical resistance changes in the presence of a magnetic field. More specifically, the invention relates to magnetic sensors and magnetic recording media employing magnetoresistive material.

Considerable effort over an extended time period has been expended in developing new sensors that employ the property of magnetoresistance, that is electrical resistance changes due to the application of magnetic fields. The most widely used material is permalloy which is an alloy of approximately 80% nickel and 20% iron. Permalloy's resistance changes only a few percent in a magnetic field. The fact that the magnetoresistive effect is so small places undesirable constraints on magnetic recording and other technologies employing magnetic field sensors. It would be desirable, therefore, to provide a magnetoresistive material whose resistance changes more than only a few percent in the presence of a magnetic field.

Another type of material has been discussed for its magnetoresistance properties is a multilayer material comprised of superimposed layers of iron, chromium, and iron. See Barthelemy et al. J. Appl. Phys. 67 (9), 5908 (May 1, 1990). The change in the magnetic state due to the application of a magnetic field changes the conduction by as much as 10% at room temperature.

A magnetoresistive material produced by physically mixing iron particles into a rubber matrix has also been produced. However, because simple mixing is employed, the small gaps required for tunneling cannot be obtained. Because rubber is a moderate conductor, it is apparent that the magnetoresistive properties of this material arise from the magnetically induced change in the distance between the iron particles altering the conventional resistance between the particles. This effect is entirely different from the resistance changes due to quantum tunneling in the magnetoresistive material according to the present invention.

SUMMARY OF THE INVENTION

Accordingly, it is an object of the present invention to provide a magnetoresistive material whose resistance changes more than only a few percent in the presence of a magnetic field.

Briefly, these and other objects are accomplished by a magnetoresistive material comprised of discrete immiscible units of magnetostrictive material separated from one another by one or more gaps. In one class of embodiments of the invention, magnetostrictive particles are embedded in a phase-separated nonmagnetostrictive matrix. In one embodiment of the invention, a magnetoresistive article is made by cosputtering particles of a magnetostrictive material and a quantity of a phase-separated nonmagnetostrictive material onto a nonmagnetostrictive substrate. The magnetostrictive particles are spaced from one another by distances in the range of 10 to 100 angstroms (10 to 150 angstroms if the gap is bridged by an appropriate semiconductor), thereby providing a plurality of gaps between the magnetostrictive particles. The gaps provide that there is no continuous conducting path through the particles.

In accordance with another aspect of the invention, a magnetoresistive article is made by employing relatively large magnetostrictive electrodes separated by a small gap on a nonmagnetostrictive substrate. A magnetic field sensor employing such an article is also provided. The small gap serves as region where electrons from an electron cloud from one magnetostrictive electrode and electrons from an electron cloud from the other magnetostrictive electrode are able to tunnel between the electrodes under the influence of an applied voltage by means of a tunnel current. Optionally, an appropriately soft semiconductor material, such as a semiconducting polymer, is placed to bridge the gap and serves to extend the electron clouds from the respective electrodes, thereby facilitating formation of a tunnel current between the electrodes. The tunnel current more readily passes through the semiconductor material than across the gap.

Sensors for detecting magnetic fields are provided which employ the magnetoresistive articles of the invention. With one embodiment of the invention, a plurality of magnetostrictive particles are separated from one another by respective small gaps provided by nonmagnetostrictive particles. The number and sizes of the respective gaps change as the magnetoresistive material of the invention is exposed to magnetic fields. The changes in resistance due to exposure to magnetic fields is used to detect and measure the magnetic fields.

Other objects, advantages and novel features of the invention will become apparent from the following detailed description of the invention when considered in conjunction with the accompanying drawings herein.

DESCRIPTION OF THE PREFERRED EMBODIMENT(S)

Figure 1:
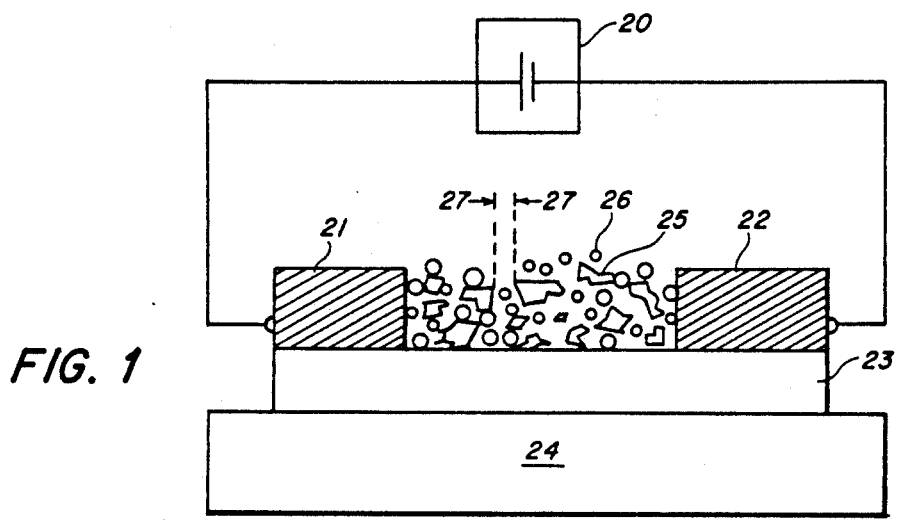
FIG. 1 shows schematically one embodiment of a magnetic field sensor of the invention.

With reference to FIG. 1, a magnetic field detector made in accordance with the invention is shown. In the detector a voltage source 20 of approximately 1 volt is connected to respective conventional nonmagnetostrictive electrodes 21 and 22 placed on a nonmagnetostrictive glass support 23 which is placed upon a nonmagnetostrictive support 24. The electrodes 21 and 22 can be spaced apart by a distance in the range of 1–5 mm. A plurality of room temperature magnetostrictive particles 25 (e.g. nickel particles in a range from 10 to 1,000 Angstroms) are surrounded by a nonmagnetostrictive matrix 26 (e.g. made up of amorphous silicon dioxide or crystalline silicon dioxide particles or alumina particles or, preferably, boron nitride particles) and are located between respective electrodes 21 and 22. For purposes of illustration to easily distinguish between the two types of particles, the magnetostrictive particles 25 are shown as rectilinear particles; and the nonmagnetostrictive particles 26 are shown as round spheres.

The magnetostrictive particles 25 in conjunction with the nonmagnetostrictive matrix 26 make up a magnetoresistive material in accordance with the invention. The magnetoresistive material of the invention deposited on the nonmagnetostrictive substrate 23 make up a magnetoresistive article in accordance with the invention.

In the absence of exposure to a magnetic field, the magnetostrictive particles 25 have initial dimensions. See FIG. 2. In the absence of exposure to a magnetic field, particle 30 has a width 32. As a result, respective gaps 27 between particles shown in FIG. 1 and gap 35 shown in FIG. 2 between particles 30 and 34 have initial values, and an initial electron tunnelling current is present across the electrodes 21 and 22 shown in FIG. 1.

Figure 3:
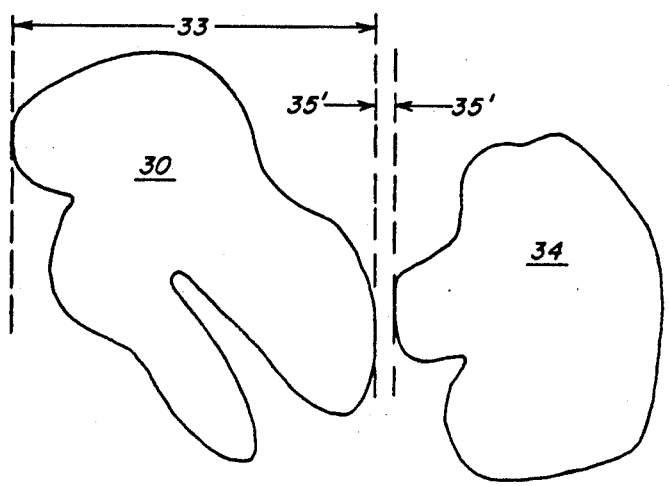
FIG. 3 is a schematic diagram showing the magnetostrictive particles of FIG. 2 under the influence of a magnetic field.

However, as shown in FIG. 3, in the presence of a magnetic field, the magnetostrictive particles 30 and 34 swell up causing the width 33 of particle 30 to be greater than the width 32 of the particle 30 in the absence of the magnetic field. In addition, the gap 35' between particles 30 and 34 in the presence of the magnetic field is less than the gap 35 between the particles 30 and 34 in the absence of the magnetic field.

Similarly, when a magnetic field is applied in the plane of the substrate 23 shown in FIG. 1, the dimensions of the magnetostrictive particles 25 change by swelling and/or contracting, and the respective gaps 27 between the particles also change. When the gaps 27 between the particles change, the resistance between the electrodes 21 and 22 also changes. When the resistance between the electrodes 21 and 22 changes, the tunnelling current between the electrodes 21 and 22 and across the gaps 27 and the particles 25 also changes. The resistance changes due to changes in the dimensions of the magnetostrictive particles 25 in a magnetic field can be used to measure the presence or strength of the magnetic field.

Figure 4:
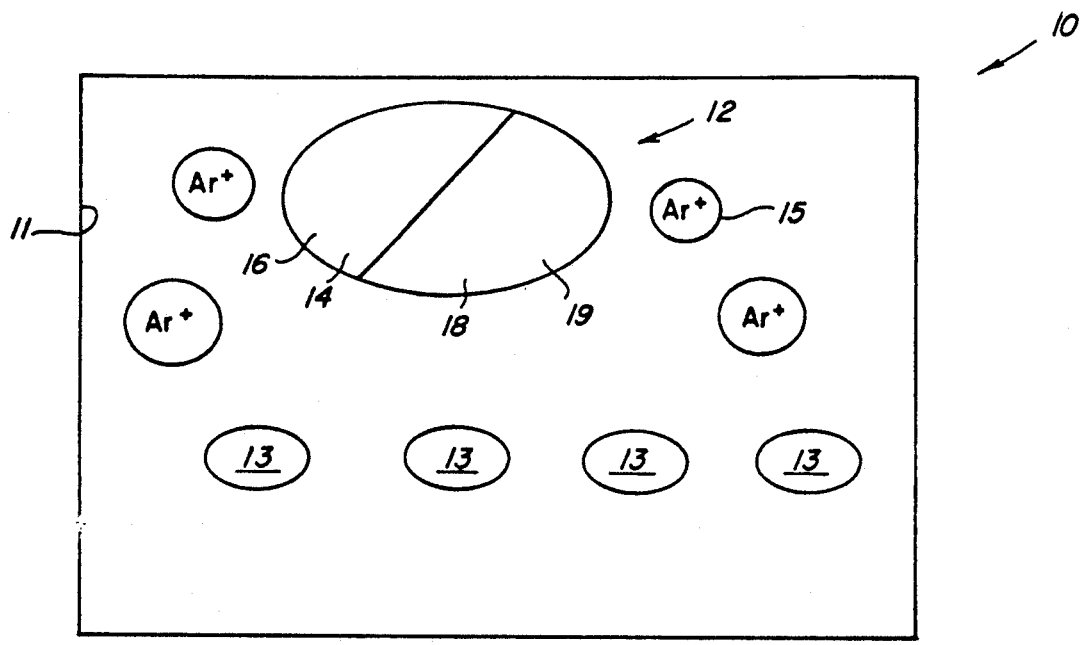
FIG. 4 is a schematic diagram of an apparatus used for forming magnetoresistive material of the invention by cosputtering magnetostrictive particles and nonmagnetostrictive particles.

The nickel particles and silicon dioxide matrix particles in FIG. 1 are cosputtered onto the substrate 23 by employing the apparatus shown in FIG. 4. They, together, form magnetoresistive film comprised of magnetostrictive particles embedded in a nonmagnetostrictive matrix. Approximately 50% of the cosputtered material is nickel particles with the remainder being the silicon dioxide. In such a case, a large number of the nickel particles would be touching one another to form agglomerations. There would be a relatively few particles that are not touching one another. There would be a large number of tunnelling paths from one electrode through gaps and through nickel agglomerations to the other electrode. This situation is desirable because, in effect, there are relatively large magnetostrictive entities (the nickel agglomerations) separated by relatively small gaps. In principle, it may be stated, that the performance of the magnetic field sensor of the invention is enhanced when relatively large magnetostrictive entities are employed, separated by relatively small gaps.

In FIG. 4, a cosputtering apparatus 10 is shown which includes a vacuum chamber 11. The cosputtering apparatus 10 includes target 12, which includes nickel 14 located on one side 16 of the target 12 and silicon dioxide 18 located on the other side 19 of the target 12. A plasma including argon ions 15 is set up in vacuum chamber 11, and the plasma dislodges atoms of nickel 14 and molecules of silicon dioxide 18 off of the target 12.

The dislodged metal atoms and semiconductor molecules phase separate on substrates 13.

It is pointed out that the silicon dioxide matrix of nonmagnetostrictive material can be controlled with respect to its amorphous or crystalline properties. When silicon dioxide is sputtered, it forms amorphous material which tends to coat the nickel particles to form a coating matrix. However, when silicon dioxide is heated sufficiently, the silicon dioxide becomes crystalline. In such an instance, when crystalline silicon dioxide is used along with nickel particles to form a phase-separated film, then silicon particles tend to surround the nickel particles.

The nonmagnetostrictive matrix is preferably a ceramic material and may be either insulating or semiconducting crystalline or amorphous. The nonmagnetostrictive material should have a sufficiently low elastic constant to permit significant expansion and contraction of the magnetostrictive material upon exposure to a magnetic field of the strength to be measured. In general, the softer the nonmagnetostrictive material, the more sensitive the magnetoresistive material will be for any magnetostrictive material employed.

As stated above, the material forming the matrix material 26 in the embodiment shown in FIG. 1 is nonmagnetostrictive. However, in an alternative embodiment based on the FIG. 1, the matrix material can also be a magnetostrictive material. In such a case the magnetostrictive characteristics of the matrix material would have magnetostrictivity characteristics of opposite sign to the magnetostrictivity characteristics of the particles 25. In this way, when the magnetic detector is exposed to a magnetic field, the particles 25 may expand, the matrix material 26 may contract, and the gaps 27 between adjacent particles 25 would be decreased.

Figure 5:
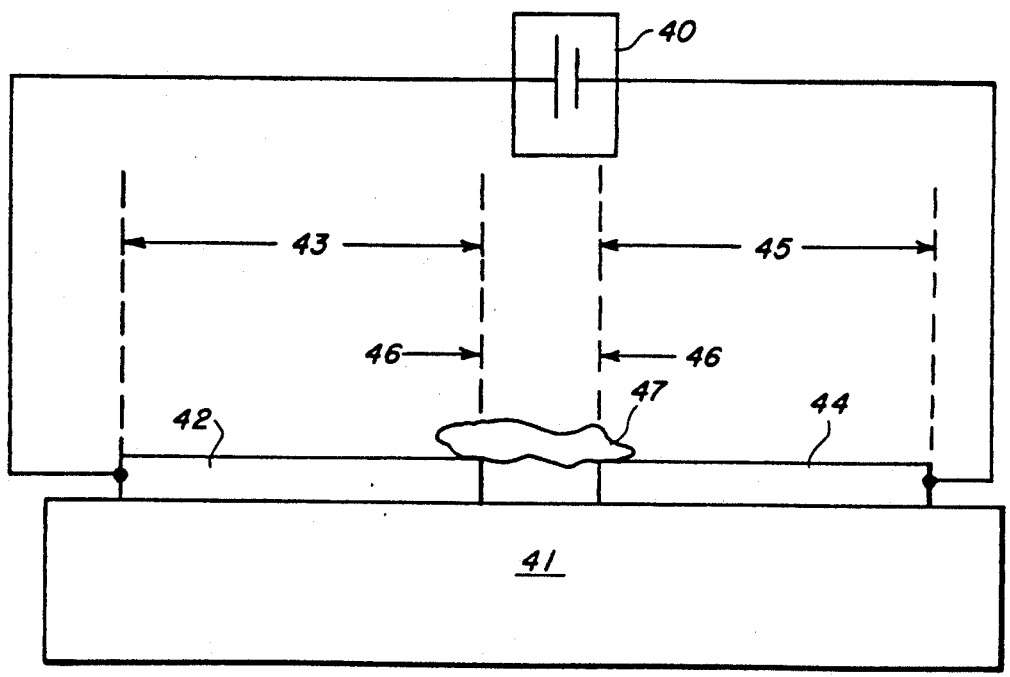
FIG. 5 is a schematic diagram of another embodiment of a magnetic field sensor of the invention.

In FIG. 5, another magnetic field detector made in accordance with the invention is shown. In the detector, a voltage source 40 of approximately 1 volt is connected to respective magnetostrictive electrodes 42 and 44 placed on a substrate 41. In the absence of exposure to a magnetic field, the electrodes 42 and 44 have respective initial lengths 43 and 45, whereby an initial gap 46 is provided. The gap is on the order of 100 Angstroms. The initial resistance across the initial gap 46 is due to an initial tunnelling current.

However, when a magnetic field is applied in the plane of the substrate 41, the respective lengths 43 and 45 of the respective magnetostrictive electrodes 42 and 44 will change due to expansion and/or contraction of the magnetostrictive material in the magnetic field, whereby the gap 46 also changes. When the gap 46 changes, the resistance across the gap 46 also changes, and the resistance changes can be used to measure the magnetic field. A quantity of semiconductor material 47 bridges the gap 46 between the electrodes 42 and 44. The semiconductor material 47 facilitates electron tunneling between the magnetostrictive electrodes 42 and 44 across the gap 46. More specifically, the semiconductor material 47 lowers the barrier height and hence will increase the tunneling current to an acceptable level, for example one milliampere, even for a value of "s" as large as 100 to 200 Angstroms. Since the length of the electrode "l" can be $10^6$ larger than "s", one would expect to observe very large effects if one uses this embodiment of the invention.

The magnetostrictive electrodes 42 and 44 in FIG. 5 may be deposited by employing a mask used with photolithography or electron beam lithography techniques to write the electrodes 42 and 44 and at the same time provide a very narrow gap 46. Using photolithographic techniques and the like, the magnetic detector shown in FIG. 5 may be made very small, on the order of 10 to microns to 1 micron across from the end of one electrode to the end of the other electrode. With such an embodiment, the gap 46 would be much smaller than 10 microns. Many of such magnetic field detectors can be made on a single chip and can be used in series or in parallel to enhance the gain of the sensor. In this embodiment, as the elastic constant and thickness of the substrate layer upon which the electrodes rest, and the thickness of the magnetostrictive electrodes increase, the clamping of the electrodes at the substrate/electrode interface becomes less significant.

The magnetic field detectors shown in FIGS. 1 and 5 can be housed in a vacuum chamber or can be exposed to ambient conditions. Furthermore, the magnetic detectors can be encapsulated. However, the encapsulation should be selected with care to prevent substantial interference with the expansion and contraction of the magnetostrictive materials in response to magnetic fields. In this respect, any material that is in contact with the magnetostrictive material should have a small elastic constant so that it does not take very much force for that material to give when the magnetostrictive material expands and contracts.

Although the detailed phenomena occurring with use of the invention are not fully understood, a theoretical explanation is provided herein in order to lend greater understanding as to the operation of the invention. The theoretical explanation does not limit the invention defined in the claims.

Figure 2:
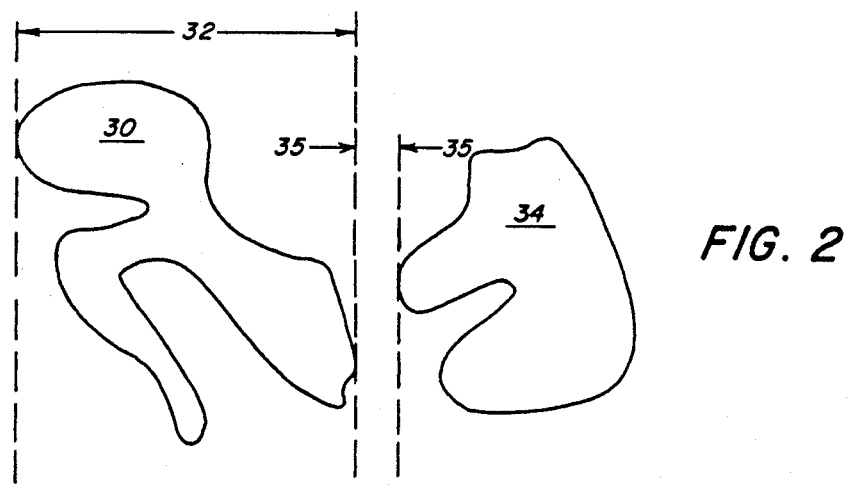
FIG. 2 is a schematic diagram showing magnetostrictive particles of the invention not under the influence of a magnetic field.

In order to get some idea of the magnitude of the magnetoresistance between the magnetostrictive particles in a magnetoresistive material made in accordance with the invention, with reference to FIGS. 2 and 3, an average distance between particles is denoted by "s"; and the average length of the particles is denoted by "l". For compositions below the percolation threshold, the resistivity of the film is determined by the ease at which electrons can tunnel between the metallic particles. This in turn is determined by the separation between the particles. In order to get some idea of the magnitude of the magnetoresistance, suppose that the resistance is determined by tunneling probability between two metallic particles separated by a distance "s".

In this case, the resistance, "R", of the film is proportional to $\exp(\lambda s)$, where $\lambda$ is a constant which determines the tunneling probability.

A change in resistance "dR" is proportional to $\lambda \exp(\lambda s)\, ds$.

Thus, $dR/R = \lambda ds$

Suppose $l = 10s$ and $ds = -dl$. Then $$dR/R = -\lambda(dl/l)l = -\lambda l(dl/l)$$

In a magnetic field, we take $dl/l = 10^{-4}$.

For tunneling to dominate the resistivity, $\lambda s = 10$ or $\lambda l = 100$.

Thus, by this calculation, $dR/R = 10^{-2}$.

For materials with a larger magnetostriction or for which the separation "s" is still smaller relative to "l", the change in "R" would be larger.

Another point to be mentioned is that the magnetostrictive film at the interface to the substrate is constrained by the substrate. The strain will be quite small for the portion of the film that is close to the substrate, i.e. approximately within 1000 Angstroms of the substrate. The portion of the film that is further away will not be very strongly affected by the constraint at the substrate interface. For films that are several thousand Angstroms thick, the effect of the interface with the substrate will not be important.

An additional point is that the complicated conducting path near the percolation threshold may enhance the magnetoresistive effect. As mentioned above, magnetostrictive particles and nonmagnetostrictive particles that are immiscible with one another to retain separate phases can be cosputtered to form a magnetoresistive material in accordance with the invention. For example, nickel particles are cosputtered with silicon dioxide particles. Once the immiscible, phase-separated particles have been cosputtered onto a substrate, an unexpected phenomenon takes place. Apparently, the nickel particles seek themselves and spit out silicon dioxide particles onto their surface. The 10 Å nickel particles grow until they are coated with silicon dioxide Nevertheless the 10 Angstrom nickel particles have the structure of bulk nickel material. This property has been measured by electron diffraction techniques.

Films of the novel magnetoresistive material of the invention can be produced in micron scale geometry. This permits their utilization in small sensors. A plurality of such sensors can be arrayed in a field gradient configuration when the magnetic field changes over a very small distance. Furthermore, the material can be cheaply produced by sputtering.

Although the embodiments of the invention described thus far provide novel magnetoresistive materials, other magnetoresistive materials can also be made employing the principles of the invention. For example, iron particles, alloys or magnetic compounds can be used instead of nickel particles as the magnetostrictive material.

It will be understood that various changes in the details, steps and arrangement of parts which have been herein described and illustrated to explain the nature of the invention, may be made by those skilled in the art within the principles and scope of the invention as expressed in the appended claims.

What is claimed is:

1. A heterogenous magnetoresistive material formed by co-sputtering a magnetostrictive material and a nonmagnetostrictive material, comprising separate particles or agglomerations of said magnetostrictive material embedded in a phase-separated matrix of said nonmagnetostrictive material, said particles or agglomerations being spaced from one another by gaps having sizes in the range of 10 to 100 angstroms, which gaps are changed in size by the application of a magnetic field, said nonmagnetostrictive material having a sufficiently higher resistance than said magnetostrictive material so that changes in the size of said gaps significantly alter an electron tunneling current applied across said gaps and electron tunneling dominates the resistivity of said magnetoresistive material.

2. The heterogeneous magnetoresistive material described in claim 1 wherein said magnetoresistive material is formed by co-sputtering particles of a magnetostrictive material and particles of a nonmagnetostrictive material.

3. The heterogeneous magnetoresistive material described in claim 1 wherein said nonmagnetostrictive material is a ceramic.

4. The heterogeneous magnetoresistive material described in claim 1 wherein said matrix of nonmagnetostrictive material is an amorphous material.

5. The heterogeneous magnetoresistive material described in claim 1 wherein said matrix of nonmagnetostrictive material is a crystalline material.

6. The heterogeneous magnetoresistive material described in claim 1 wherein:
said particles of magnetostrictive material include particles of nickel, and
said matrix of nonmagnetostrictive material includes silicon dioxide.

7. The heterogeneous magnetoresistive material described in claim 1 wherein said separate particles of magnetostrictive material includes two different magnetostrictive materials.

8. The heterogeneous magnetoresistive material described in claim 1 wherein said separate particles of magnetostrictive material consists essentially of one material.

9. The heterogeneous magnetoresistive material described in claim 3 wherein said nonmagnetostrictive material is boron nitride.

10. A heterogeneous magnetoresistive article, comprising a quantity of magnetoresistive material described in claim 1 deposited on a nonmagnetostrictive substrate.

11. The heterogeneous magnetoresistive article described in claim 10 wherein said magnetoresistive material is formed by co-sputtering particles of a magnetostrictive material and a quantity of a phase-separated nonmagnetostrictive material on a nonmagnetostrictive substrate.

12. The heterogeneous magnetoresistive article described in claim 10 wherein said substrate is glass.

13. The heterogeneous magnetoresistive materials described in claim 1, wherein said separate particles of magnetostrictive material have a size range of from 10 to 1,000 Angstroms.

14. The heterogeneous magnetostrictive material of claim 1, wherein said nonmagnetostrictive material is an insulator or semiconductor.

15. The heterogenous magnetostrictive material of claim 1, wherein most of said magnetostrictive material is included as said agglomerations having sizes larger than said gaps.

16. A sensor for detecting a magnetic field, said sensor having a heterogeneous structure comprising:
an insulating substrate,
a plurality of magnetostrictive electrodes supported by the insulating substrate and spaced from one another by gaps, filled by said insulating substrate, which are changed in size by the application of a magnetic field to the electrodes, said insulating substrate having a sufficiently higher resistance than said magnetostrictive electrodes so that changes in the size of said gaps significantly alter an electron tunneling current applied across said gaps and electron tunneling to dominates the resistivity of said magnetoresistive material, the size of said gaps being modulated in the range of from 10 to 150 angstroms.

17. The sensor described in claim 16 wherein said substrate is composed of glass.

18. The sensor described in claim 16 said magnetostrictive electrodes are composed of nickel.

19. The sensor described in claim 16, wherein said gap is modulated between 10 and 100 angstroms.

20. The sensor described in claim 16 wherein said substrate is a nonmagnetostrictive material.

21. A heterogeneous magnetoresistive material comprised of separate, co-sputtered particles or agglomerations of particles of magnetostrictive material having a magnetostrictivity of one sign embedded in a magnetostrictive matrix having a magnetostrictivity of opposite sign, said particles or agglomerations of particles being separated by gaps filled with said magnetostrictive matrix, said gaps having sizes in the range of 10 to 100 angstroms, which gaps are changed in size by the application of a magnetic field, said magnetostrictive matrix material having a sufficiently higher resistance than said particles or agglomerations of magnetostrictive material so that changes in the size of said gaps significantly alter an electron tunneling current applied across said gaps and electron tunneling dominates the resistivity of said magnetoresistive material.

22. The heterogeneous magnetostrictive material of claim 21, wherein said magnetostrictive matrix is an insulator or semiconductor.

23. A method for making a magnetoresistive material comprising the step of co-sputtering particles of a magnetostrictive material and a quantity of a phase-separated nonmagnetostrictive material onto a nonmagnetostrictive substrate to form a heterogenous magnetoresistive material comprising separate particles or agglomeration of said magnetostrictive material embedded in a phase-separated matrix of said nonmagnetostrictive material, said particles or agglomerations being spaced from one another by gaps having sizes in the range of 10 to 100 angstroms, which gaps are changed in size by the application of a magnetic field, said nonmagnetostrictive material having a sufficiently higher resistance than said magnetostrictive material so that changes in the size of said gaps significantly alter an electron tunneling current applied across said gaps and electron tunneling dominates the resistivity of said magnetostrictive material.

24. The method of claim 23, wherein said nonmagnetostrictive material is an insulator or semiconductor.

* * * * *